United States Patent [19]

Plows

[11] 4,169,244
[45] Sep. 25, 1979

[54] ELECTRON PROBE TESTING, ANALYSIS AND FAULT DIAGNOSIS IN ELECTRONIC CIRCUITS

[76] Inventor: Graham S. Plows, Church La., Balsham, Cambridge CB1 6DS, England

[21] Appl. No.: 874,761

[22] Filed: Feb. 3, 1978

[51] Int. Cl.² ............... G01R 31/22; G01R 15/12; G01R 31/02
[52] U.S. Cl. .................. 324/158 R; 324/51; 324/73 PC
[58] Field of Search ......... 324/158 P, 158 F, 158 D, 324/73 R, 73 PC, 158 R, 51

[56] References Cited

U.S. PATENT DOCUMENTS

| | | | |
|---|---|---|---|
| T930,006 | 1/1975 | Beaufrere et al. | 324/158 D |
| 3,373,353 | 3/1968 | Harris | 324/54 |
| 3,448,377 | 6/1969 | Seiwatz et al. | 324/54 |
| 3,531,716 | 9/1970 | Tarui et al. | 324/158 R |
| 3,549,999 | 12/1970 | Norton | 324/73 R |
| 3,678,384 | 7/1972 | Oatley | 324/158 R |
| 3,796,947 | 3/1974 | Harrod et al. | 324/158 P |
| 3,934,199 | 1/1976 | Channin | 324/73 R |

OTHER PUBLICATIONS

Engel et al., "Electron Beam Testing . . .", J. Phys. D., Appl. Phys., 1970, vol. 3, pp. 1505-1508.

*Primary Examiner*—Rudolph V. Rolinec
*Assistant Examiner*—Ernest F. Karlsen
*Attorney, Agent, or Firm*—Roylance, Abrams, Berdo & Farley

[57] ABSTRACT

A method of testing electronic networks in which an electron probe is moved from point to point in the network and a current of secondary electrons emitted in response to the impingement of the probe is converted to a signal denoting voltage or field strength at the various points. A scanning apparatus in which an electronic collector including grids in the path of the beam and an annular scintillator is described.

7 Claims, 2 Drawing Figures

TO HIGH VACUUM PUMPING SYSTEM

TO HIGH VACUUM PUMPING SYSTEM

ELECTRON PROBE TESTING, ANALYSIS AND FAULT DIAGNOSIS IN ELECTRONIC CIRCUITS

SUMMARY OF THE INVENTION

This invention relates to a method of testing, that is to say examination, analysis or fault diagnosis, of electronic networks, i.e., circuits and other devices.

Part of the invention resides in a method of testing of an electronic network which is energized as if for operation during its testing, the method comprising directing an electron probe at various points in the network in an orderly sequence and converting a current of secondary electrons which are emitted from the impingement in response to the impingement of the electron probe into an electrical signal which denotes the values of an electrical or electromagnetic parameter which is exhibited by the network at the various points. The method is particularly intended for use in testing complex electrical circuits, such as printed circuits, after they have been assembled.

Another part of the present invention resides in a scanning apparatus which facilitates the performance of the aforementioned method but which may have a more general utility. The scanning apparatus preferably comprises an electron gun for the production of an electron probe, a scanning control for the probe, a holder capable of supporting a specimen such that the beam can impinge substantially normally on the specimen, and an electronic collector which includes an electronically transmissive grid disposed in the path of the probe, the grid being operable to accelerate, away from the specimen, secondary electrons emitted from the specimen, and a receptor, disposed laterally of the path of the beam, for the collection of secondary electrons which pass through the grid. Preferably, for reasons explained hereinafter, an additional electronically transmissive grid is disposed adjacent and parallel to the first-mentioned grid. The receptor may comprise a scintillator which has a surface of reception which is disposed laterally of the path of the probe and may be annular. A further grid, for attraction of the secondary electrons to the scintillator, may be disposed immediately in front of the scintillator. The significance and convenience of the scanning apparatus will be explained hereinafter.

BRIEF DESCRIPTION OF THE DRAWINGS

Reference will hereinafter be made to the accompanying drawings, of which.

DESCRIPTION OF THE PREFERRED EMBODIMENT

Figure 1:
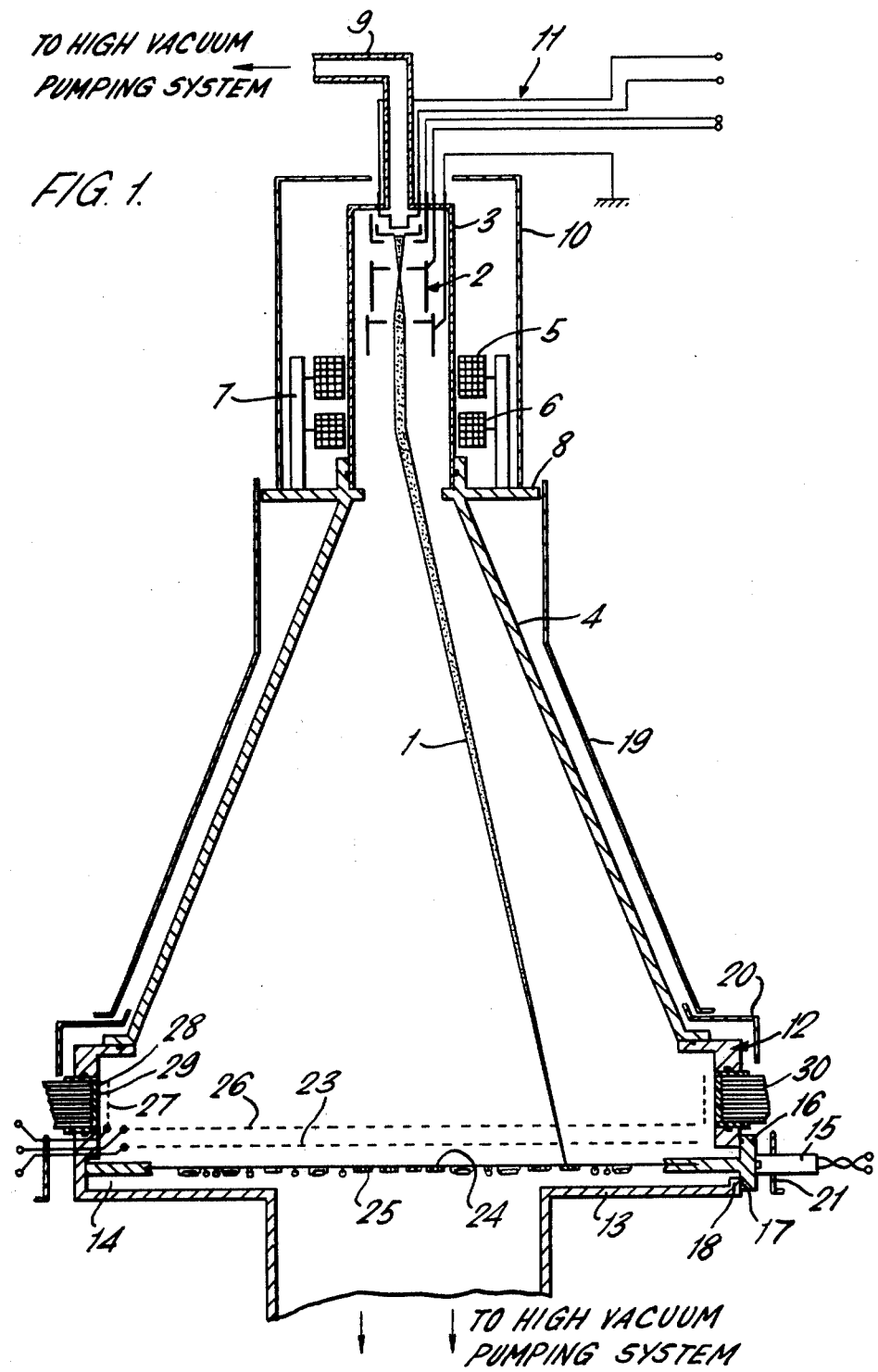
FIG. 1 is a schematic diagram of a scanning apparatus.

It is already known to test or examine electronic circuits, such as printed circuits or integrated circuits, in two principal ways. The first way, conveniently called functional testing, comprises the application of appropriate signals to input terminals of the circuit and the examination of voltages or currents or both at output terminals. The input signals may be varied and the output signals may be examined for corresponding variation until the operation of the circuit is found to be correct for the entire range of input signals for which it has been designed. It may be supposed that when the circuit responds correctly to all the different stimuli with which it is tested, every part of the circuit operates correctly but in practice it is difficult to test complex circuits fully in this manner.

It is also known to test a circuit, which is energised as if for normal operation, by internal probing. It is known, for example, to prepare, for testing an electronic circuit, a programme which specifies a sequence of tests, such as the determination of the voltage (relative to some datum) at each of a succession of points inside the circuit. The programme may be performed with the aid of a data processor, the successive values of the voltage, or other electrical parameter as the case may be, being fed to the computer as the programme of testing proceeds. Such a programme may indicate a fault, such as when a particular voltage falls outside a range of tolerance for the particular point that is tested. The existence of a fault may be ascertained by the computer and the programme may prescribe a routine for the discovery of the source of, or method for the rectification of, the particular fault. The routine may comprise a series of instructions for the application of the probe to a particular set of points in the circuit. It is also known to use, in place of a hand-held probe, a mechanical probe which may be moved under the automatic control of test equipment to engage various points in the circuit which is under test and to perform the test programme at least partially automatically under the control of a computer programme.

Neither the formulation of a testing programme nor any particular testing programme is part of the present invention, but it will be presumed that the reader is familiar with the programmed testing of electronic circuits in the manner described. The testing of complex printed or integrated circuits by means of a mechanical probe is slow and cumbersome and at the present time functional testing is usually the first resort and a probing test the last resort of a tester.

The present invention is based on the use of an electron probe, namely a focussed electron beam which can be deflected and of which the amplitude may preferably be modulated, which is directed by some agency, usually a computer but possibly by a human operator, to a sequence of points on the surface of an electronic circuit. The action of the electron probe causes the emission from the electronic circuit of a current of secondary electrons. This current may be subjected to discrimination which allows the passage only of electrons of which, for example, the kinetic energy or the direction of travel falls within a particular range, associated with the point of impingement, according to the particular criterion of discrimination. The parameter may be the surface electrical potential, that is the voltage (with reference to a datum) at the point of impingement of the electron probe, the electric field close to the point of impingement of the electron probe and close to the surface of the electronic circuit under test, or the electromagnetic field close to the point of impingement of the electron probe and close to the surface of the electronic circuit under test. In the specific example which will be described later, the electronic collector, namely the combination of the filter for secondary electrons, any intermediate or guiding electrons, the electrodes or surfaces which absorb the secondary electrons remaining after filtering and associated components which ultimately convey a signal representing the aforementioned parameter, is designed to produce a signal representing the surface electrical potential of each tested point, and will be called a voltage sensitive collector, but the disclosed apparatus may readily be modified to detect the other parameters if their measurement is preferred.

Accordingly, if for example a voltage sensitive collector is used, the electron probe may be directed to impinge on any given node of the electronic circuit under test, and the voltage sensitive collector will provide an output signal indicative of the voltage at that node provided that the voltage does not, independently of the electronic circuit, vary according to its location. For any given combination of voltages or currents applied to the input terminals of the electronic circuit under test, the voltages of many nodes, in a predetermined sequence, within the electronic circuit may be rapidly determined owing to the ease with which the direction of the electron probe can be altered. It is alternatively possible to direct the electron probe precisely at a particular node and vary the inputs of the electronic circuit or to combine, in a testing programme, the examination of a multiplicity of nodes with appropriate variation of the inputs of the electronic circuit.

FIG. 1 illustrates the vacuum enclosure, the arrangements for generation, focussing and deflection of the electron beam, herein called electron probe, and the position and general nature of a voltage sensitive electron collector for the testing of an electronic circuit which in this example is a double-sided printed circuit board of which the electronic components are mounted on the underside. The electron probe will impinge on the back surface of the printed circuit board and each test point or node on which the probe rests for a determination of the surface electrical potential will be either a solder blob at the end of a component's terminal lead or a nearby part of a conductive track. An electron probe 1 is in this example produced by an electron gun 2 which differs from the ordinary gun used in cathode-ray tube by some slight modifications which enable the cathode to run in a demountable system. The glass cone and screen of the cathode-ray tube have been removed. The gun 2 is mounted, as usual, in a glass neck 3 but the end of this neck is demountably sealed into the narrow end of a metallic (mild steel) cone 4. The focussing coils 5 and the deflection coils 6 for the electron probe are gimbal mounted, for accurate adjustment, on a frame 7 carried on a flange 8 which extends abaxially from the narrower end of the cone 4. A tube 9, which extends from the rear of the glass neck 3, and which is normally used in the evacuation of the cathode-ray tube and then pinched off permanently, is left open and is demountably coupled to a vacuum pump (not shown) which maintains a high vacuum in the region of the electron gun.

The glass tube is surrounded by a mu-metal shield 10 which is apertured to accommodate the tube 9 and electrical terminal connections 11 for the electron gun.

At the base of the cone is a chamber principally defined by a cylindrical frame 12 which has an inner end flange sealed to the mouth of the cone 1 and, in its outer face 13, a port coupled to another vacuum pump which maintains a high vacuum in the region of the electronic circuit under test.

The electronic circuit itself is mounted, normal to the undeflected direction of the probe 1 by means of a holder comprising, for one side of the printed circuit board, any suitable bracket 14 and for the other side, which bears the terminals of the electronic circuit, an edge connector 15 which is mounted in a plate 16 which carries on its inner surface an O-ring seal 17 which engages a flat external surface of the side wall 18 of the test chamber. Accordingly, all the input and output terminals of the printed circuit board are external to the vacuum chamber and connection to them may be made in air. The mounting plate 16, and the test circuit mounted on it, may be inserted into the test chamber horizontally. A prevacuumed cartridge which might contain a multiplicity of circuits for testing could readily be used if preferred. A new test circuit may be rapidly exchanged for one on which tests are complete and the test chamber may be rapidly evacuated of air. Mu-metal shields 19, 20 and 21 encircle the cone 1 and the test chamber.

The voltage sensitive electron collector comprises in this example a combination of components, which will now be described.

Closest to, and parallel with, the back surface of the printed circuit board is a planar grid 23 which is electronically transmissive. It is out of focus for the primary electron beam, constituted by the probe 1, and its pitch and bar width are chosen to ensure negligible variation in the primary electron beam as it scans the back surface 24 of the printed circuit board 25. The grid 23 is maintained at 500 volts positive in this example, so that all secondary electrons of low energy emitted from the test point are accelerated towards the first grid. The majority of these secondary electrons penetrate this grid.

Parallel to, and adjacent the upper side of the first grid is a second, similarly electronically transmissive planar grid 26. This grid is likewise out of focus for the primary electron beam and its pitch and bar width are similar to those of the first grid so that the second grid may be disposed in register with the first grid to permit the maximum transmission through these grids of both the primary electron beam and secondary electrons. Those secondary electrons which penetrate the first grid 23 experience a retarding field between the first grid 23 and the second grid 26. The second grid is usually maintained at a voltage ($V_2$) which is between zero and 5 volts negative with respect to the potential of the test point. There may be also a contact surface potential difference between the test point and the second grid. This may be compensated by an appropriate setting of the voltage of the second grid. If the test point is at zero voltage, those secondary electrons which are emitted from the test point with a component of velocity, normal to the second grid, greater than $\sqrt{(2e/m)|V_2|}$ m/sec where E is the electronic charge and M is the electron mass, will penetrate the second grid. Those secondary electrons emitted with a lesser normal component of velocity will not penetrate the second grid. If the test point is at $-2.5$ volts, for example, all secondary electrons emitted from the test point with a component of velocity normal to the second grid greater than $\sqrt{(2e/m)(|V_2|-2.5)}$ m/s will penetrate the second grid. The fraction of secondary electrons which are transmitted through the second grid will be greater when the test point is at $-2.5$ volts than it is when the test point is at zero volts. Thus the fraction of the secondary electrons transmitted through the second grid is a function of the voltage of the test point and may be used to indicate or measure that voltage. The foregoing explanation omits for convenience reference to variations, due to the material of the specimen, or the microscopic angle of incidence, in the secondary emission. The action of normalising nullifies that variation.

The secondary electrons (of low energy) which penetrate the second grid are pulled towards a third grid 27 which is preferably constituted by an annular mesh held at 500 volts positive or more. The mesh 27, as the first and second grids, has a high transmission factor.

Those electrons which penetrate the third grid 27 are accelerated to an annular plastics scintillator 28 which is coated on its inner surface with a thin film 29 of aluminium held at 10 kilovolts. Most of the electrons penetrate the thin film of aluminium to produce scintillations. Most of the light from the scintillations is collected by a close array of optical fibres 30 cemented to the outer vertical surface of the annular scintillator 28. The optical fibres are brought together in a bundle which feeds the light received by the fibres to the cathode of a photo-multiplier 31 (shown in FIG. 2) the output of which is amplified by an amplifier 32 that preferably comprises a transresistance amplifier which provides an output voltage across a low output impedance. The voltage output is an indication of the voltage of the test point on the printed circuit board.

Normally the electron probe would be brought to rest for each of the points that are tested in order that the test voltage may be properly ascertained and corelated with signals that identify that particular test point, but even so it is possible to examine, using the apparatus of FIG. 1, 1000 or more test points in less than 100 milliseconds.

Figure 2:
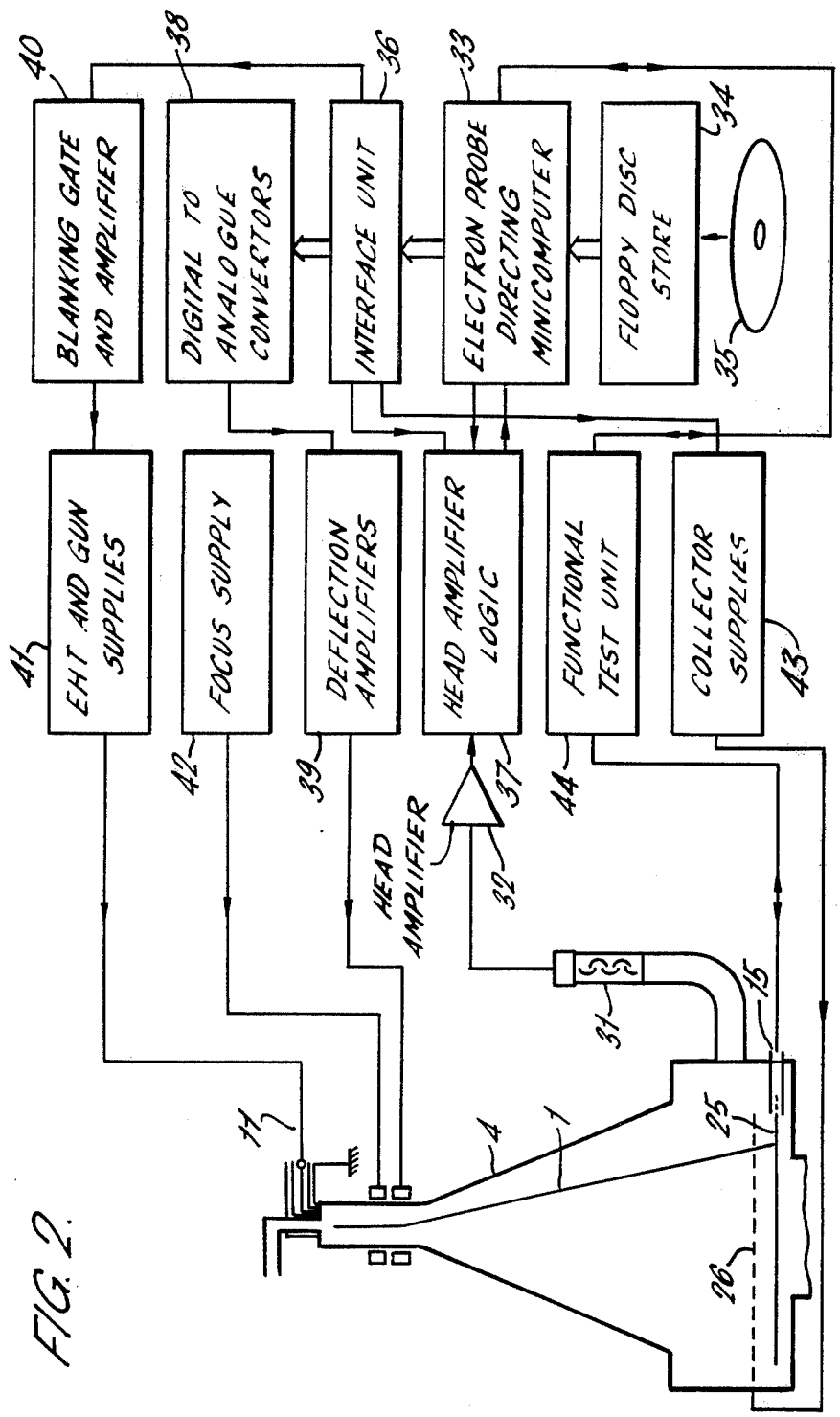
FIG. 2 is a schematic diagram of the scanning apparatus in conjunction with a control system.

FIG. 2 illustrates schematically a control system including a mini computer that directs the electron probe. The description is given merely by way of example and instruction which is unnecessary for those skilled in the art is omitted. The control system principally comprises a mini computer 33 which derives a test programme from a store 34 which is adapted to receive a floppy disc 35 which is pre-recorded with a programme appropriate for testing a particular circuit. The system includes an interface unit 36 which provides control signals for logic circuits 37 associated with the amplifier 32, digital-to-analogue converters 38, which control deflection amplifiers 39 for the electron gun and blanking gates and amplifiers 40 which control power supplies 41 for the various parts of the electron gun. The control system also includes an electrical supply 42 for the focussing coils 5 and another electrical supply 43 for the various grids of the electron collector; the electrical supplies 43 are under the control of the mini computer 33 through the intermediary of the interface unit 36. The present system also includes a functional test unit 44, controlled by the mini computer 33.

A testing procedure commences with the loading into the test chamber of a circuit to be tested and the loading of a test programme, pre-recorded on a floppy disc, into the store 34. The test programme comprises a sequence of logical tests intended to provide optimum speed of testing and, if desired, fault diagnosis. Usually the programme would include both functional tests and probing tests. If the sequence specifies a functional test for which probing is unnecessary or inappropriate, the functional test would be performed by the functional test unit which, under the control of the mini computer 33 and in known manner, applies appropriate input signals to certain terminals of the tested circuit and feeds output signals obtained from the tested circuit to the mini computer. During a mere functional test, the electron probe would be blanked off.

Most programmes will however specify a combination of functional tests and probing tests. It is desirable before such a test sequence is started, to ensure that the electron probe is correctly registered with the pattern. The usual tooling marks on the printed circuit board may be used for this purpose. These marks may be simply located by sweeping the beam over an area large compared with the marks and watching for a suitable transition in the output signal of the amplifier 32. Biasses for the X and Y deflection coils may then be appropriately adjusted. The registration process may readily be carried out automatically with the aid of the mini computer.

When a probing test is to be made, the mini computer will occasion the production of appropriate input signals to the test circuit, with the aid of the functional test unit, and will feed to the interface unit coded signals specifying the coordinates (usually "X" and "Y" coordinates) of each of the points to be tested in sequence. The interface unit will feed separate binary numbers to the digital-to-analogue converters 38 to provide X and Y deflection signals which are fed to the deflection coils 6 by the deflection amplifiers 39. The mini computer may also instruct the blanking gate and amplifier which, after a time suitable for settling of the deflection currents, switch on the electron probe and then blank it before the probe is moved towards the next test point. The mini computer may also occasion the switching of the supply to the second grid 26 to a voltage such as 10 volts positive for the first part of the dwelling time of the electron probe. For this particular voltage for the second grid, the output voltage $V_{cn}$ of the amplifier 32 is characteristic of the total or normalising low energy secondary emission. The voltage of the second grid may be switched to the filtering voltage (between 0 and 5 volts as mentioned above,) for the last part of the dwell time; during this last part the output voltage $V_{cv}$ of the amplifier 32 is characteristic of the voltage of the test point. The test point voltage will be denoted by the ratio $V_{cv}/V_{cn}$, because the normalising operation compensates for variations from point to point in the yield and angular distribution of the secondary emission.

Finally, the interface unit will instruct a gate in the head amplifier's logic circuit to open for the correct periods in order that the values of $V_{cn}$ and $V_{cv}$ may be recorded. The ratio of these two values may be found and compared within the head amplifier's logic with a "correct" value supplied to a comparator for the purpose by the mini computer. The result of the comparison will be fed back to the mini computer for a decision to proceed with the next test in the sequence.

The mini computer will move the electron probe through the test point specified for the given combination of input signals, which values can be stored for comparison of the complete set with a correct complete set or which can be taken individually to indicate faults of particular gates or in particular sub-systems of the electronic circuit. It is readily possible to programme the mini computer to step through a complete fault diagnosis and indicate by an output to a visual display unit or other peripheral unit the nature and location of any fault.

It is generally possible to probe electronic currents in conductors and circuit components, rather than voltages at nodes, using electron collectors sensitive to electromagnetic fields. In general, all forms of electronic circuit, large scale or medium scale integrated circuits, individual components, microwave integrated circuits, or surface acoustic wave devices in which metal conductors are mounted on a piezoelectric material, may be tested in a manner similar to that described in the foregoing.

I claim:

1. A method of testing the operation of, and diagnosing faults in, a finished electronic circuit, which has accessible terminals requiring particular energization when the circuit is operational, the method comprising the steps of:
    applying to the said terminals of the electronic circuit signals corresponding to those which the circuit requires for normal operation;
    directing an electron probe comprising a beam of electrons at a succession of points in the network in an orderly sequence;
    producing during a respective dwell time a steady current of secondary electrons emitted from each of the points in the network in response to impingement of the probe on the circuit;
    providing during the dwell time a potential barrier filter to the current of secondary electrons and thereby permitting passage of the secondary electron current according to the potential difference between the test point and a predetermined filter potential; and
    converting the current of secondary electrons into a signal representative of the value of at least the voltage, exhibited by the network at each of the succession of points.

2. A method according to claim 6, in which the various points are disposed in substantially a common plane which is substantially normal to the direction of the electron probe and the conversion of secondary electrons into the said signal is performed by means of a collector which includes an electronically transmissive grid disposed parallel to the said plane and a receptor, disposed laterally of the electron probe and to which secondary electrons accelerated by the aforementioned grid are directed.

3. An electron probe scanning apparatus comprising:
    an electron gun for the production of a focused electron probe;
    a scanning control for the probe;
    holder means for supporting an electronic network at a location suitable for longitudinal impingement and transverse scanning of points in the network by the probe;
    said holder means including means for applying to said network signals corresponding to those required by the circuit for normal operation;
    a collector comprising mutually parallel first and second electronically transmissive grids disposed adjacent said specimen holder means between it and said electron gun, the pitch and bar widths of said grid being selected to ensure negligible effect of said grids on said electron probe;
    a receptor situated transversely displaced from the path of the probe;
    means for energizing said grids for the attraction of secondary electrons from the specimen and the transmission of a fraction of said secondary electrons to said receptor after transit of the said fraction through the second grid; and
    means coupled to said receptor for producing a quantitative indication of electrons received at said receptor as a measure of the voltage at the points scanned by said probe.

4. An apparatus according to claim 3, wherein the receptor is disposed longitudinally displaced from and circumferentially of the location scanable by the electron probe.

5. An apparatus according to claim 3, wherein the receptor comprises a scintillator for emission of light in response to the reception of the said secondary electrons, said apparatus further comprising optical guide means for reception of said light and a photodetector coupled to the optical guide means.

6. An apparatus according to claim 3, further comprising means coupled to the scanning control for effecting automatic positioning of the probe at a predetermined series of locations.

7. An apparatus according to claim 6 wherein said scanning control includes means for registering a prearranged signal from the receptor corresponding to the impingement of the probe on a fiducial mark on a specimen and means for positioning the probe with respect to said mark.

* * * * *